United States Patent
Starnes et al.

(10) Patent No.: US 11,356,782 B2
(45) Date of Patent: **\*Jun. 7, 2022**

(54) TWO-DIMENSIONAL DISTRIBUTED MODE ACTUATOR

(71) Applicant: Google LLC, Mountain View, CA (US)

(72) Inventors: Mark William Starnes, Sunnyvale, CA (US); James East, San Jose, CA (US)

(73) Assignee: Google LLC, Mountain View, CA (US)

( \* ) Notice: Subject to any disclaimer, the term of this patent is extended or adjusted under 35 U.S.C. 154(b) by 173 days.

This patent is subject to a terminal disclaimer.

(21) Appl. No.: 16/886,989

(22) Filed: May 29, 2020

(65) Prior Publication Data

US 2020/0296517 A1 Sep. 17, 2020

Related U.S. Application Data

(63) Continuation of application No. 15/853,289, filed on Dec. 22, 2017, now Pat. No. 10,681,471.

(51) Int. Cl.
*H04R 17/10* (2006.01)
*H01L 41/09* (2006.01)
(Continued)

(52) U.S. Cl.
CPC .............. *H04R 17/10* (2013.01); *G01L 5/167* (2013.01); *H01L 41/0471* (2013.01);
(Continued)

(58) Field of Classification Search
CPC .... H04R 17/10; H04R 7/045; H04R 2440/05; H04R 2499/11; G01L 5/167; H01L 41/0471; H01L 41/0966; H01L 41/253
See application file for complete search history.

(56) References Cited

U.S. PATENT DOCUMENTS

| 5,632,841 A | 5/1997 | Hellbaum et al. |
| 7,149,318 B2 | 12/2006 | Bank et al. |

(Continued)

FOREIGN PATENT DOCUMENTS

| CN | 1839659 | 5/2011 |
| CN | 1969591 | 5/2011 |

(Continued)

OTHER PUBLICATIONS

KR Office Action in Korean Appln. No. 10-2019-7033572, dated Jul. 14, 2020, 16 pages (English translation).

(Continued)

*Primary Examiner* — Daniel Pihulic
(74) *Attorney, Agent, or Firm* — Fish & Richardson P.C.

(57) ABSTRACT

Methods, systems, and apparatus for using a two-dimensional distributed mode actuator. One of the systems includes a transducer adapted to create a force to cause vibration of a load to generate sound waves, the transducer having a first width along a first axis; a transfer portion connected to the transducer along a first side parallel to the first axis, and having a second width along the first axis that is less than the first width; and a stub connected to the transfer portion along a second side of the transfer portion that is parallel to the first axis and an opposite side from the first side connected to the transducer, having a third width that is greater than the second width, and having a surface adapted to connect to the load to transfer the force received from the transducer through the transfer portion to the load.

20 Claims, 5 Drawing Sheets

(51) Int. Cl.
*G01L 5/167* (2020.01)
*H01L 41/047* (2006.01)
*H01L 41/253* (2013.01)
*H04R 7/04* (2006.01)

(52) U.S. Cl.
CPC ........ *H01L 41/0966* (2013.01); *H01L 41/253* (2013.01); *H04R 7/045* (2013.01); *H04R 2440/05* (2013.01); *H04R 2499/11* (2013.01)

(56) References Cited

U.S. PATENT DOCUMENTS

| | | | |
|---|---|---|---|
| 8,707,012 B2 | 4/2014 | Espasa et al. | |
| 10,681,471 B2* | 6/2020 | Starnes | H01L 41/253 |
| 10,999,681 B2* | 5/2021 | Starnes | H04R 9/025 |
| 2009/0045700 A1 | 2/2009 | Sasaki et al. | |
| 2019/0200139 A1* | 6/2019 | Starnes | H04R 17/10 |
| 2020/0228898 A1* | 7/2020 | Starnes | H04R 9/063 |
| 2020/0296515 A1* | 9/2020 | Starnes | H04R 9/025 |
| 2020/0296517 A1* | 9/2020 | Starnes | G01L 5/167 |

FOREIGN PATENT DOCUMENTS

| | | | | |
|---|---|---|---|---|
| CN | 106465014 | | 2/2017 | |
| CN | 112868246 A | * | 5/2021 | H04R 7/04 |
| EP | 3223539 | | 9/2017 | |
| JP | 2006116399 | | 5/2006 | |
| JP | 2011129971 | | 6/2011 | |
| KR | 1020080069225 | | 7/2008 | |
| KR | 1020150055086 | | 5/2015 | |
| KR | 1020170040616 | | 4/2017 | |
| WO | WO 1996031333 | | 10/1996 | |
| WO | WO 1997009842 | | 3/1997 | |
| WO | WO 2005027571 | | 3/2005 | |
| WO | WO 20170091509 | | 6/2017 | |
| WO | WO 2019122892 | | 6/2019 | |
| WO | WO-2020149946 A1 | * | 7/2020 | H04R 9/066 |
| WO | WO-2020190343 A1 | * | 9/2020 | H04R 9/046 |

OTHER PUBLICATIONS

CN Office Action in Chinese Appln. No. 201880031657.0, dated Oct. 12, 2020, 20 pages (with English translation).
Extended Search Report on European Appln. No. 21187749.3, dated Oct. 14, 2021, 10 pages.
Office Action in Indian Appln. No. 201947045928, dated Oct. 7, 2021, 5 pages (with English translation).
PCT International Preliminary Report on Patentability in International Appln. No. PCT/GB2018053712, dated Mar. 3, 2020, 14 pages.
PCT International Search Report and Written Opinion in International Appln. No. PCT/GB2018053712, dated Mar. 26, 2019, 13 pages.
PCT Written Opinion in International Appln. No. PCT/GB2018/053712, dated Oct. 29, 2019, 7 pages.
TW Office Action in Taiwan Appln. No. 107144954, dated Dec. 9, 2019, 14 pages (with machine translation).
Office Action in Korean Appln. No. 10-2021-7016418. dated Aug. 25, 2021, 17 pages (with English translation).
KR Office Action in Korean Appln. No. 10-2019-7033572, dated Mar. 8, 2021, 3 pages (with English translation).
KR Office Action in Korean Appln. No. 10-2019-7033572, dated Jan. 12, 2021, 8 pages (with English translation).
Office Action in Japanese Appln. No. 2019-563173, dated Aug. 3, 2021, 6 pages (with English translation).
Decision to Grant a Patent in Japanese Appln. No. 2019-563173, dated Dec. 21, 2021, 5 pages (with English translation).
Office Action in Korean Appln. No. 10-2021-7016418, dated Feb. 7, 2022. 3 pages (with English translation).

* cited by examiner

TWO-DIMENSIONAL DISTRIBUTED MODE ACTUATOR

CROSS-REFERENCE TO RELATED APPLICATION

This application is a continuation of U.S. application Ser. No. 15/853,289, filed Dec. 22, 2017, the contents of which are incorporated by reference herein.

BACKGROUND

Some devices use a panel loudspeaker to generate sound. A panel loudspeaker is a speaker that creates sound by causing a panel to vibrate. A panel loudspeaker may use a distributed mode actuator ("DMA"), e.g., a piezoelectric transducer, to cause the panel to vibrate and generate sound instead of a voice coil actuator. For instance, a smartphone may include a DMA that applies force to a display panel (e.g., a LCD or an OLED panel) in the smartphone. The force creates vibrations of the display panel that couple to surrounding air to generate sound waves, e.g., in the range of 20 Hz to 20 kHz which may be audible to a human ear.

SUMMARY

A two-dimensional distributed mode actuator may generate force in multiple dimensions to provide a system that includes the actuator, such as a smartphone, a wider output frequency range, a reduced actuator length, or both, compared to single-dimensional distributed mode actuators that generate force in a single direction, e.g., along a length of the single-dimensional actuator. For instance, the two-dimensional actuator may generate separate forces along a length and a width of the actuator and transfer these forces to a load, such as a speaker, to cause the load to generate sound. The two-dimensional distributed mode actuator also has different vertical, e.g., height, displacement along the width of the actuator, while a single-dimensional actuator has constant vertical displacement along its width.

The two-dimensional distributed mode actuator includes a transducer connected to a stub. The transducer includes a width and a length that define a surface that generates force for the two-dimensional distributed mode actuator. A connection between the transducer and the stub may be along only a portion of the width of the transducer and only a portion of a width of the stub to allow the transducer's surface to move separately along the length and the width of the surface.

When the two-dimensional distributed mode actuator receives an input signal, the two-dimensional distributed mode actuator can cause different sections of the transducer's surface to move separately along a height axis. The height axis is perpendicular to the axes for the length and the width of the actuator. A first section of the transducer adjacent to or near the connection with the stub may move minimally, or remain stationary. A second section of the transducer, along the same end of the transducer as the connection with the stub but that is separated from the stub by a gap, may move along the height axis based on the received input. A third section of the transducer, separated lengthwise from the connection with the stub, may also move along the height axis based on the received input. The actuator may cause the second section and the third section to move separately, e.g., the second section and the third section may be at different positions along the height axis.

In general, one innovative aspect of the subject matter described in this specification can be embodied in a system, e.g., a distributed mode actuator system, that includes a transducer adapted to create a force to cause vibration of a load to generate sound waves, the transducer having a first width along a first axis; a transfer portion connected to the transducer along a first side parallel to the first axis, and having a second width along the first axis that is less than the first width; and a stub connected to the transfer portion along a second side of the transfer portion that is parallel to the first axis and an opposite side from the first side connected to the transducer, having a third width that is greater than the second width, and having a surface adapted to connect to the load to transfer the force received from the transducer through the transfer portion to the load and cause the load to vibrate. Other embodiments of this aspect include corresponding computer systems, methods, and computer programs recorded on one or more computer storage devices, each configured to perform the actions of the operations. The computer system may include one or more computers and can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

In general, one innovative aspect of the subject matter described in this specification can be embodied in a system, e.g., a smartphone, that includes a display; and a distributed mode actuator comprising: a transducer adapted to create a force to cause vibration of a load to generate sound waves, the transducer having a first width along a first axis; a transfer portion connected to the transducer along a first side parallel to the first axis, and having a second width along the first axis that is less than the first width; and a stub connected to the transfer portion along a second side of the transfer portion that is parallel to the first axis and an opposite side from the first side connected to the transducer, having a third width that is greater than the second width, and having a surface adapted to connect to the load to transfer the force received from the transducer through the transfer portion to the load and cause the load to vibrate. Other embodiments of this aspect include corresponding computer systems, methods, and computer programs recorded on one or more computer storage devices, each configured to perform the actions of the operations. The computer system may include one or more computers and can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

In general, one innovative aspect of the subject matter described in this specification can be embodied in methods that include the actions of receiving, by a transducer included in a distributed mode actuator and having a first width along an axis, an activation signal; converting, by the transducer, the activation signal to a force; transferring, by the transducer, at least a portion of the force to a transfer portion included in the distributed mode actuator and fixedly connected along a first side of the transfer portion to the transducer along only a portion of the first width, the first side having a second width along the axis that is less than the first width; and transferring, by the transfer portion, at least a portion of the force to a stub a) that is fixedly connected to the transfer portion along a second side of the transfer portion that is an opposite side from the first side, and b) having a third width along the axis that is greater than the second width, to cause the stub to transfer at least a portion of the force to a load to generate sound waves. Other embodiments of this aspect include corresponding computer systems, apparatus, and computer programs recorded on one or more computer storage devices, each configured to perform the actions of the methods. A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

The foregoing and other embodiments can each optionally include one or more of the following features, alone or in combination. The transducer may have a first height that is shorter than the first width and along a second axis perpendicular to the first axis. The transducer may have a first length that is longer than the first height and along a third axis, perpendicular to both the first axis and the second axis. The transfer portion may have a second height that is equal to the first height and along the second axis. The transfer portion may have a second length that is less than the second width and along the third axis. The stub may have a third height that is less than the third width and along the second axis. The stub may have a third length that is less than the third width and along the third axis.

In some implementations, the transducer may have a second surface defined by the first width and the first length of the transducer. The second surface may include two or more sections along the second axis that are adapted to move separately from each other. The first length may be longer than the first width. The transfer portion may connect to only one end of the first side of the transducer. The transfer portion may connect to a center of the first side of the transducer. A ratio of the second width of the transfer portion to the first width of the transducer may be between about 1:5 to about 4:5, e.g., between about 1:5 to about 2:5. The ratio of the second width of the transfer portion to the first width of the transducer may be about 2:5 or about 3:5. A ratio of a length to a width of the transducer may be between about 1:1 to about 3:1. The ratio of the length to the width of the transducer may be about 1.5:1.

In some implementations, a force created by the transducer may have a step between a first resonance peak and a second resonance peak. The first resonance peak may be between 300 Hz and 1 kHz. The second resonance peak may be between 3 kHz and 8 kHz. The system may include a frame connected to the stub and surrounding at least two surfaces of the transducer. The transducer may be piezoelectric. The transducer may be ceramic. The load may be a display panel. The display may be the load. The distributed mode actuator may include a drive module to provide voltage to one or more electrodes each of which are connected to the transducer and included in the distributed mode actuator to cause the transducer to move and create the force.

Among other advantages, the systems and methods described in this document may generate sound at a wider frequency range, have a shorter length, or both, compared to other actuators (such as single-dimensional distributed mode actuators). For example, the distributed mode actuator described in this document may have a shorter length for a given power output compared to other actuators. In some implementations, the systems and methods described in this document may cause a system's output to be more efficient than output generated by other systems, e.g., to use less power. In some implementations, the systems and methods described in this document may provide a wider treble frequency range compared to other systems. The systems and methods described in this document may provide these benefits with little or no loss in bass frequency ranges. In some implementations, the systems and methods described in this document may provide an output frequency range that is independent of a length of an actuator. In some implementations, the systems described in this document may have an increased number of modes in the band of interest, e.g., at which the system can generate sound, with an increased number of force peaks in the band of interest, compared to other systems. The systems described in this document may have increased output at the force peaks compared to other systems.

The details of one or more implementations of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
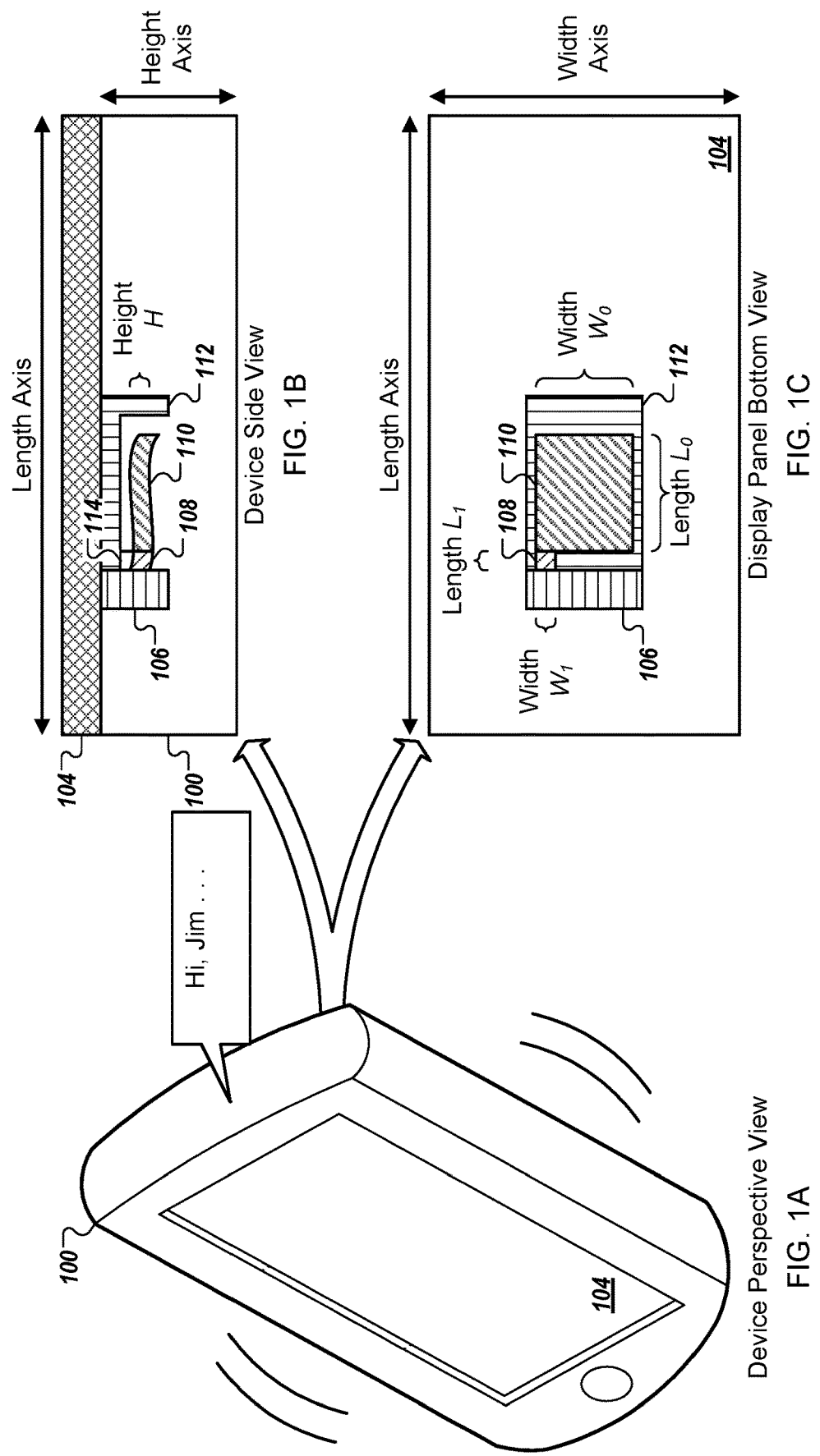
FIGS. 1A-C depict an example device that includes a two-dimensional distributed mode actuator.

FIGS. 1A-C depict an example of a device 100 that includes a two-dimensional distributed mode actuator. The device 100, such as a smartphone or another type of computer, uses the two-dimensional distributed mode actuator and a panel loudspeaker to generate sound. The sound may be any type of sound, such as a phone conversation, music, an audio stream, sound for a video, or sound for a game. The device 100 may be any appropriate type of device that includes a panel loudspeaker.

The panel loudspeaker includes a panel 104 that vibrates and generates sound waves. The panel 104 may be any appropriate panel included in the device 100 that can generate sound waves. For instance, the panel 104 may be a display panel included in the device 100. The display panel may include a touch screen or any other appropriate type of display.

The panel 104 is connected to a stub 106, shown in FIGS. 1B-C, that transfers a force from a transducer 110 to the panel 104. A combination of a piezoelectric plate included in the transducer 110, a transfer portion 108, and the stub 106 form the two-dimensional distributed mode bending wave actuator. In some examples, the transducer 110 can be cantilevered.

The panel 104 is rigidly connected to the stub 106 so that the stub 106 can efficiently transfer force to the panel 104. The panel 104 may be permanently, e.g., fixedly, connected to the stub 106, e.g., such that removal of the panel 104 from the stub 106 will likely damage the panel 104, the stub 106, or both. In some examples, the panel 104 is removably connected to the stub 106, e.g., such that removal of the panel 104 from the stub 106 will not likely damage the panel 104 or the stub 106. The panel 104 may connect to a first surface of the stub 106.

The stub 106 is a hard material, e.g., that does not deform. For example, the stub 106 may be a metal, a hard plastic, or another appropriate type of material.

In some implementations, one or more other components may be part of the connection between the panel 104 and the stub 106. For example, the stub 106 may rigidly connect to a chassis that rigidly connects to the panel 104. In some examples, the chassis is not part of the panel loudspeaker. In some examples, the chassis is part of the panel loudspeaker.

The transducer 110 is connected to the stub 106 by the transfer portion 108 to allow transfer of at least some of a force, generated by the transducer 110, from the transducer 110, through the transfer portion 108 and the stub 106, and into the panel 104. A second surface of the stub 106 may connect to the transfer portion 108, e.g., the second surface of the stub 106 may connect to a third surface of the transfer portion 108. The connection may be a rigid connection. In some examples, the transfer portion 108 is part of the stub 106, e.g., a single piece may include both the transfer portion 108 and the stub 106. The second surface of the stub 106 may be perpendicular to the first surface of the stub 106. The connection between the stub 106 and the transfer portion 108 may be fixed or may be removable.

The transducer 110 can be rigidly connected to the transfer portion 108. For example, a fourth surface of the transfer portion 108 may rigidly connect to a fifth surface of the transducer 110. The fourth surface of the transfer portion 108 may be a surface on a side of the transfer portion 108 opposite the third surface of the transfer portion 108. In some examples, the transfer portion 108 is part of the transducer 110, e.g., a single piece may include both the transfer portion 108 and the transducer 110. The connection between the transfer portion 108 and the transducer 110 may be fixed or may be removable.

In some implementations, the two-dimensional distributed mode actuator includes a second stub 114 located between the transfer portion 108 and a frame 112. For instance, the second stub 114 can be physically located only between the transfer portion 108 and the frame 112, e.g., the second stub 114 may have the same width as the transfer portion 108. The second stub 118 may be a damper that reduces movement, e.g., along the height axis, of the transfer portion 108.

The second stub 114 may be any appropriate material. For instance, the second stub 114 may be a soft material (e.g., an elastomeric material) that provides a means for absorbing energy, may reduce the Q of the resonances (e.g., a measure of peak sharpness), or both. The second stub 114 may improve drop test reliability for the transducer 110, or otherwise improve the ability of the transducer 110 to withstand impacts. In some examples, the second stub 114 may be rubber.

The transducer 110 generates the force by actuating in response to receipt of one or more signals from a drive module included in the device 100. The two-dimensional distributed mode actuator or the panel loudspeaker or both, e.g., when the actuator is part of the loudspeaker, may include a drive module that receives input signals from another component, e.g., from a processor included in the device 100, and converts the input signals into signals that cause movement of the transducer 110. The drive module may be implemented in hardware, software, or both. For instance, the drive module may include one or more processors, one or more memories, and a voltage source. The drive module may use the one or more processors to execute instructions stored on the one or more memories to determine an amount of voltage, or multiple amounts of voltage, to provide to the transducer 110 and cause the two-dimensional distributed mode actuator, the panel loudspeaker, or both, to generate a sound.

For instance, the drive module may receive an input signal that identifies a sound for the two-dimensional distributed mode actuator, the panel loudspeaker, or both, to generate. The sound may be any appropriate type of sound, e.g., for a phone application, a music application, a video application, or another type of application. The drive module may convert the received input signal into one or more activation signals that will cause actuation of the transducer 110. The activation signals may include voltage that activates an electrode included in the transducer 110.

The transducer 110 includes multiple electrodes each of which is connected to the drive module. At least some of the electrodes may receive a separate signal, e.g., voltage, from the drive module. When an electrode receives a signal from the drive module, the electrode produces an electric field across at least a portion of a layer of the transducer 110. In some examples, the electric field causes a physical change in dimension of the transducer 110, e.g., of the layer, and the associated displacement of the transducer 110 generates a force. The electrode may produce the electric field in conjunction with another electrode on an opposite side of the layer of the transducer. The other electrode may be a ground electrode or another appropriate type of electrode. In some examples, electrodes on opposite sides of the layer may cause different changes to the size of the transducer 110 which cause the transducer 110 to generate a force.

Figure 2:
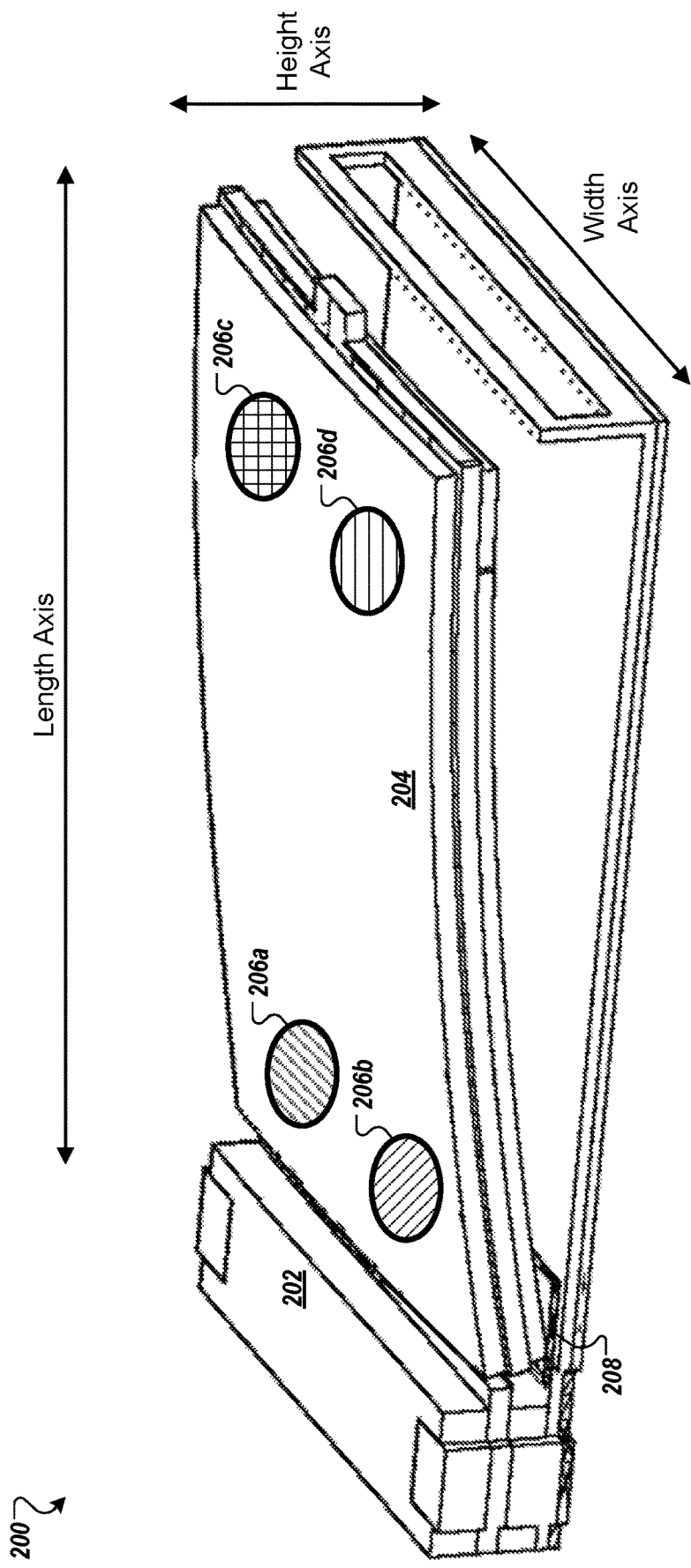
FIG. 2 depicts a perspective view of a two-dimensional distributed mode actuator with separate actuator movement along both a length and a width of a transducer.

FIG. 2 depicts a perspective view of a two-dimensional distributed mode actuator 200 with separate actuator movement along both a length and a width of a transducer 204. The two-dimensional distributed mode actuator 200, includes a stub 202 connected to the transducer 204 by a transfer portion. Connection by only the transfer portion allows separate vertical movement along a height axis of different sections 206a-d of the transducer 204.

The different sections 206a-d of the transducer 204 may be part of a unitary layer of the transducer 204. For instance, the transducer 204 might not have gaps that separate the different sections 206a-d and may have at least a common central layer for the sections 206a-d.

Each of the sections 206a-d may have a separate electrode or may have one or more common electrodes that cause a change in size of the transducer 204. The change in size of the transducer 204 causes a change in displacement of the sections 206a-d. For instance, when a section gets smaller, the change in size may cause that section to move along the height axis. The two-dimensional distributed mode actuator 200 may include two electrodes that contact each of the sections 206a-d, one on top of a central layer of the transducer 204 and one on the bottom of the central layer.

The two-dimensional distributed mode actuator 200 may allow separate adjustment of the voltages provided to the two electrodes. In some examples, a first electrode may connect to a first section 206a, a second electrode may connect to a second section 206b, a third electrode may connect to a third section 206c, and a fourth electrode may connect to a fourth section 206d.

The different sections 206a-d are separated along a width axis, a length axis, or both, and at least two of the different sections 206a-d are separated along the width axis. For instance, the first section 206a is separated along the width axis from the second section 206b. The first section 206a is separated along both the width axis and the length axis from a fourth section 206d. In some implementations, the transducer 204 may have three or more sections separated along the width axis, e.g., the first section 206a, the second section 206b, and another section separated along the width axis from both the first section 206a and the second section 206b.

The transfer portion extends along only some of the width of the transducer 204, as shown in FIGS. 1B-C. This allows different sections 206a-b of the transducer 204 that are all near the stub 202 to have different vertical movement, different vertical movement ranges, or both, along a height axis. For example, the first section 206a of the transducer 204, near the transfer portion and the stub 202, has a smaller vertical movement range along a height axis compared to the second section 206b of the transducer 204, near the stub 202, which has a larger vertical movement range along the height axis. The first section 206a is closer to the transfer portion than the second section 206b which causes the first section 206a to have a smaller vertical movement range than the second section 206b. The first section 206a and the second section 206b may be the same distance from the stub 202. For instance, the distances between the first section 206a and the stub 202, and between the second section 206b and the stub 202 may both be along the length axis.

Since the transfer portion has a smaller width than, and does not extend along the entire width of, the transducer 204, the first section 206a is configured to move separately from the second section 206b, the third section 206c, and the fourth section 206d of the transducer 204. For instance, when a panel loudspeaker that includes the distributed mode actuator 200 generates a particular sound, the first section 206a may have a first vertical position along the height axis, the second section 206b may have a second vertical position along the height axis, the third section 206c may have a third vertical position along the height axis, and the fourth section 206d may have a fourth vertical position along the height axis. At least two of the first vertical position, the second vertical position, the third vertical position, and the fourth vertical position are different positions. For example, the first vertical position, the second vertical position, and the fourth vertical position can be different positions along the height axis, while the second vertical position can be the same position as the third vertical position along the height axis.

The first section 206a may have a limited vertical movement range along the height axis compared to the other sections 206b-c of the transducer 204. For instance, the first section 206a may have a limited vertical movement range because the transducer 204 is rigidly connected to the transfer portion in an area of the transducer 204 near the first section 206a.

In some implementations, the first section 206a may have a limited movement range when the two-dimensional distributed mode actuator 200 includes a second stub 208 separate from the stub 202. The second stub 208 may be located near a surface of the transducer 204 that is perpendicular to a surface of the transducer 204 that connects to the transfer portion.

The first section 206a may be adjacent to and touch the second stub 208 when a panel loudspeaker that includes the two-dimensional distributed mode actuator 200 does not generate any sound. When a panel loudspeaker that includes the two-dimensional distributed mode actuator 200 generates sound, the second stub 208 may limit the vertical movement range of the first section 206a along the height axis. For instance, the second stub 208 may prevent the first section 206a from moving more than a threshold amount toward the second stub 208 along the height axis. In some examples, the second stub 208 may allow the first section 206a to move in only a single direction along the height axis from an inactive position maintained by the first section 206a when the panel loudspeaker that includes the two-dimensional distributed mode actuator 200 does not generate sound. The single direction may be away from the second stub 208. The second stub 208 may be positioned above, below, or to the side of the transducer 204 depending on the orientation of the two-dimensional distributed mode actuator 200.

The second stub 208 may extend along only some of the width of the transducer 204. For instance, the second stub 208 may extend along a portion of the width of the transducer 204 near the transfer portion, e.g., closer to the first section 206a than the second section 206b. The second stub 208 may have the same width as the transfer portion.

Figure 3:
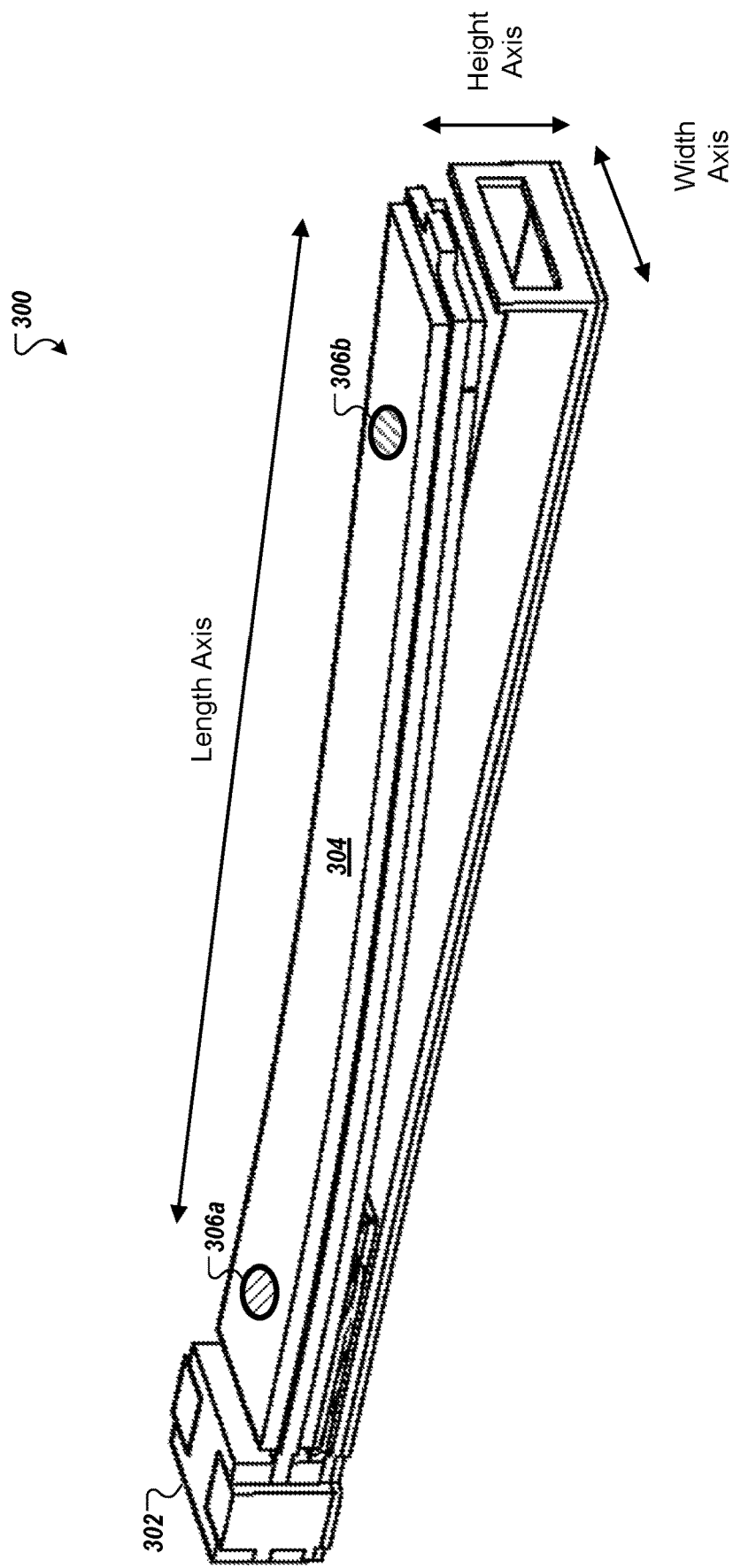
FIG. 3 depicts a perspective view of a single-dimensional distributed mode actuator with separate actuator movement along only a length of a transducer.

FIG. 3 depicts a perspective view of a single-dimensional distributed mode actuator 300 with separate actuator movement along only a length of a transducer 304. The single-dimensional distributed mode actuator 300 includes a stub 302 that is connected along substantially the entire width of the transducer 304. For example, the transducer 304 may connect to the stub 302 along an entire width of the transducer 304, an entire width of the stub 302, or both. This connection allows the single-dimensional distributed mode actuator 300 to have separate vertical movement along a height axis between sections 306a-b of the transducer 304 separated along a length axis and not to have separate vertical movement between sections separated along a width axis.

Returning to FIGS. 1B-C, a first width $W_0$ of the transducer 110 is greater than a second width $W_1$ of the transfer portion 108. For instance, the transfer portion 108 only connects to a portion of the transducer 110 along a width axis that is sufficient to allow separate movement of different sections of the transducer 110 along a height axis.

In some implementations, a ratio of the second width $W_1$ of the transfer portion 108 to the first width $W_0$ of the transducer 110 is less than 1:1. For instance, the ratio of the second width $W_1$ to the first width $W_0$ is between about 1:5 to about 4:5. The ratio of the second width $W_1$ to the first width $W_0$ may be between about 1:5 to about 2:5.

The transfer portion 108 may connect to one end of a surface of the transducer 110 as defined by the width axis, as shown in FIG. 1C. For example, the transducer 110 may have a surface near the transfer portion 108 that is defined by the width axis and the height axis. The transfer portion 108 may be located to one end of the surface along the width axis, e.g., such that the transfer portion is flush with a second surface defined by the length axis and the height axis.

In some implementations, the transfer portion 108 might not connect to one end of a surface of the transducer 110 that is defined by the width axis. For instance, the transfer portion 108 may connect to a middle section of the transducer 110 surface along the width axis. The transfer portion 108 may be centered along the width axis on the surface or connected to another portion of the surface that is not an end of the surface along the width axis.

The transfer portion 108 may have a height H that is the same as a height H of the transducer 110. In some implementations, the transfer portion 108 and the transducer 110 may have different heights. For instance, the transducer 110 may have a height that is greater than a height of the transfer portion 108.

The transducer 110 has a length $L_0$. The transfer portion 108 has a length $L_1$ that is shorter than, equal to, or longer than the length $L_0$. Including the transfer portion 108 in the two-dimensional distributed mode actuator may allow the transducer 110 to have a shorter length $L_0$ than a single-dimensional distributed mode actuator. The two-dimensional distributed mode actuator may have a larger width $W_0$ than a single-dimensional panel loudspeaker.

A ratio of the transducer 110 length $L_0$ to width $W_0$ is between about 1:1 to about 3:1. In some examples, the ratio between the length $L_0$ to the width $W_0$ is about 1.5:1, e.g., 22:15.

A width of the stub 106 along the width axis may be the same as, less than, or greater than the width $W_0$ of the transducer 110. The width of the stub 106 may be greater than or the same as the width $W_1$ of the transfer portion 108. A height of the stub 106 along the height axis may be less than the width of the stub 106. The stub 106 height may be greater than the height H of the transducer 110. In some examples, the stub 106 height may be the same as or greater than the width of the stub 106. A length of the stub 106 along the length axis may be less than the width of the stub 106. In some examples, a length of the stub 106 may be greater than or equal to the width of the stub 106. The stub 106 length is less than the length $L_0$ of the transducer 110.

The two-dimensional distributed mode actuator may include a frame 112. The frame 112 may provide a large coupling area, e.g., a repeatable bond area, for the two-dimensional distributed mode actuator with the panel 104. The frame 112 may be any appropriate type of material. For instance, the frame 112 may be stainless steel.

In some implementations, the frame 112 may protect the transducer 110, the transfer portion 108, or both, from damage. For instance, a material of the frame 112 may be selected to protect the transducer 110, the transfer portion 108, or both, from damage when the device 100 is dropped, during manufacturing or assembly of the two-dimensional distributed mode actuator or a device that includes the two-dimensional distributed mode actuator, or both.

The layer included in the transducer 110 may be any appropriate type of piezoelectric material. For instance, the layer may be a ceramic or crystalline piezoelectric material. Examples of ceramic piezoelectric materials include barium titanate, lead zirconium titanate, bismuth ferrite, and sodium niobate, for example. Examples of crystalline piezoelectric materials include topaz, lead titanate, lithium niobate, and lithium tantalite.

The electrodes included in the transducer 110 may be connected to the layer in any appropriate manner. For instance, the electrodes may be fixedly connected to the layer during manufacturing, e.g., through a deposition and patterning process. The electrodes may include separate grounds. In some examples, at least some of the electrodes may include a common ground.

Figure 4:
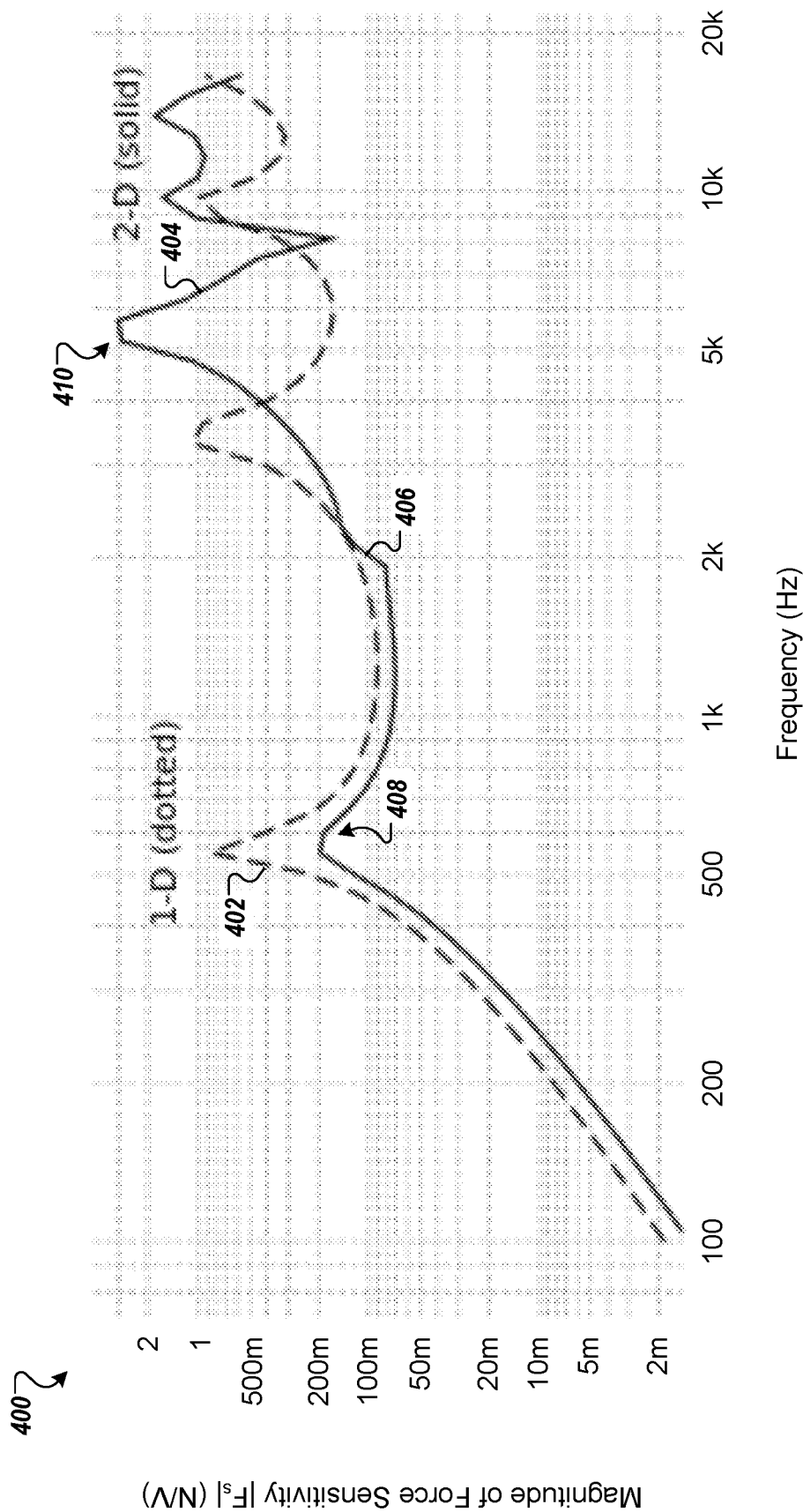
FIG. 4 depicts a graph showing a relationship between a force generated by each of two different actuators versus frequency.

FIG. 4 depicts a graph 400 showing a relationship between a force generated by each of two different actuators versus frequency. The horizontal axis of the graph 400 is frequency. The vertical axis of the graph 400 is magnitude of force sensitivity, measured in Newtons per volt.

The force may be generated by the respective actuator when the actuator is mounted on a high mechanical impedance. The vertical axis in the graph 400 defines an amount of force the respective actuator, e.g., the respective DMA, applies to a very hard object to move object, e.g., with a high mechanical impedance, when one volt is applied to the actuator included in the actuator.

For instance, the graph 400 includes a first line 402 for the resonance frequencies of a single-dimensional distributed mode actuator, e.g., the single-dimensional distributed mode actuator 300. The graph includes a second line 404 for the resonance frequencies of a two-dimensional distributed mode actuator, e.g., the two-dimensional distributed mode actuator from FIG. 1 or the two-dimensional distributed mode actuator 200. The two-dimensional actuator may be a multilayer piezo-electric actuator so the force generated is multiplied by the number of layers included in the actuator, e.g., fifteen.

The graph 400 indicates that a two-dimensional distributed mode actuator may have better high frequency resonance compared to a single-dimensional distributed mode actuator. For instance, the second line 404 for the two-dimensional distributed mode actuator is, on average in a high resonance frequency range, above the first line 402 for the single-dimensional distributed mode actuator. The high resonance frequency range may be resonance frequencies above 4 kHz.

An output created by a two-dimensional distributed mode actuator, in Newtons per volt, may have a step 406 between two resonance frequencies, e.g., as shown by the second line 404. The two resonance frequencies may be selected based on an application for which a two-dimensional distributed mode actuator is manufactured. For instance, the first resonance peak 408 may be between 300 Hz and 1 kHz, for generation of audio, e.g., a phone conversation. The second resonance peak 410 may be between 3 kHz and 8 kHz, for generation of audio, e.g., a phone conversation.

In some implementations, positions for one or both of the resonance peaks 408, 410 may be adjusted based on the length of the actuator, the width of the actuator, the length of the transfer portion, the width of the transfer portion, or a combination of two or more of these. For instance, the second peak may be based on the length, the width, or both, of the actuator. The first peak may be based on the length of the actuator, the width of the actuator, the length of the transfer portion, the width of the transfer portion, or a combination of two or more of these.

Figure 5:
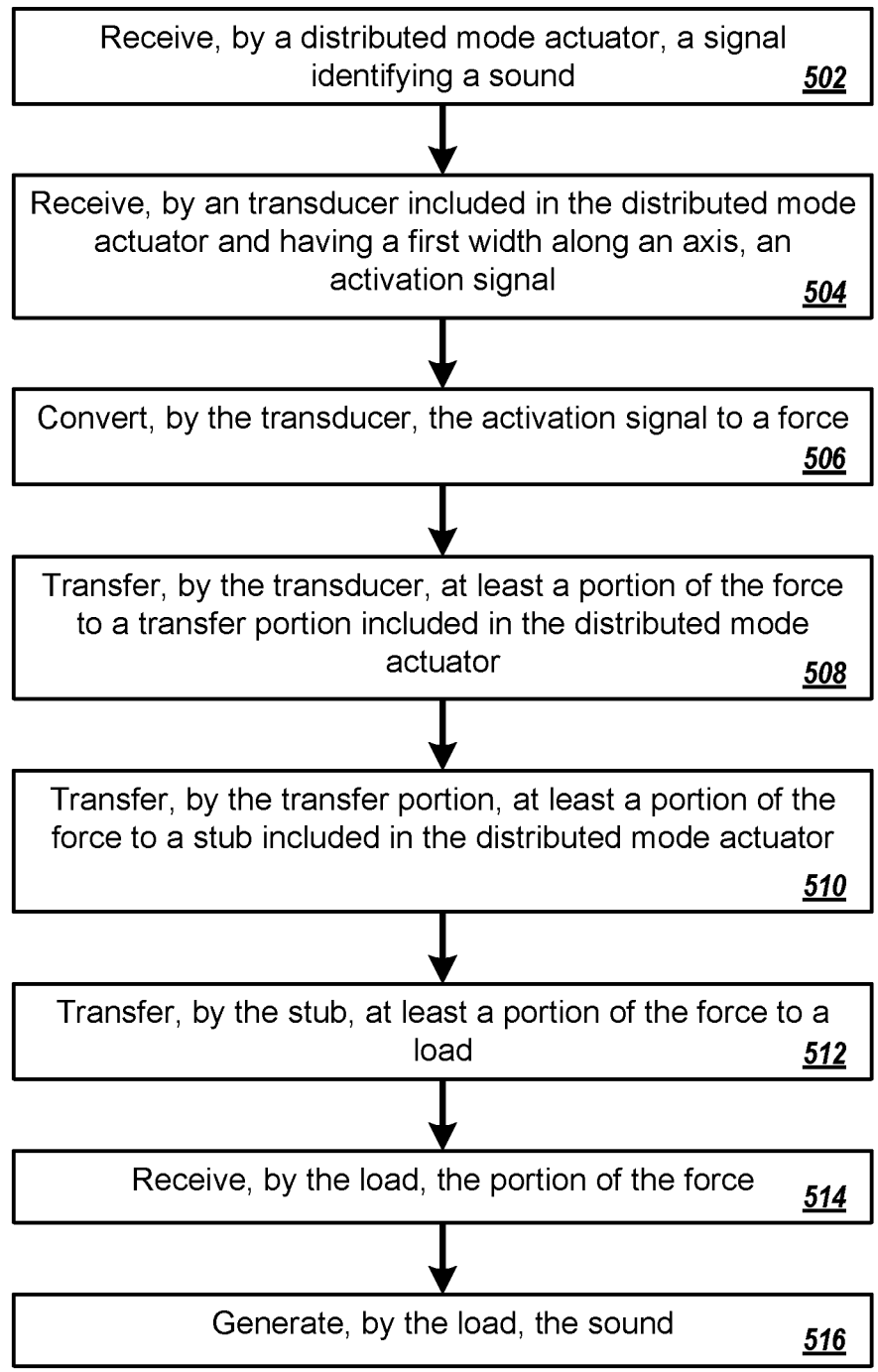
FIG. 5 is a flow diagram of a process for generating sound using a two-dimensional distributed mode actuator.

FIG. 5 is a flow diagram of a process 500 for generating sound using a two-dimensional distributed mode actuator. For example, the process 500 can be used by the two-dimensional distributed mode actuator from FIG. 1 or the two-dimensional distributed mode actuator 200.

A distributed mode actuator receives a signal identifying a sound (502). For example, a drive module included in the distributed mode actuator may receive the signal. The drive module may use the signal to generate one or more activation signals for an actuator.

A transducer included in the distributed mode actuator receives an activation signal (504). The actuator may be a two-dimensional distributed mode actuator. The transducer has a first width along an axis, e.g., along a width axis. The transducer may receive the activation signal from a drive module included in the distributed mode actuator. In some examples, the transducer may receive multiple activation signals from the drive module, e.g., when the transducer includes multiple electrodes.

The transducer converts the activation signal to a force (506). For instance, one or more electrodes included in the transducer receive the activation signals. The activation signals may be voltage generated by the drive module. The activation signal may be the same for each of the electrodes included in the transducer. The activation signal may be different for at least some of the electrodes included in the transducer. The electrodes use the activation signals to generate an electric field that causes a physical change in a layer of the transducer and displacement of sections of the transducer. Displacement of the sections of the transducer generates a force.

The transducer transfers at least a portion of the force to a transfer portion included in the distributed mode actuator (508). For instance, the transducer is fixedly connected along only a portion of the first width of the transducer to a first side of the transfer portion. The connection between the transducer and the transfer portion causes transfer of the portion of the force to the transfer portion. The first side has a second width, along the axis, that is less than the first width.

The transfer portion transfers at least a portion of the force to a stub included in the distributed mode actuator (510). The stub is fixedly connected to the transfer portion along a second side of the transfer portion that is an opposite side from the first side. Receipt of the portion of the force by the stub causes the stub to transfer at least a portion of the force to a load to generate sounds waves. The stub has a third width along the axis that is greater than the second width.

The stub transfers at least a portion of the force to a load (512). For instance, the stub may transfer the portion of the force to a display panel included in a smartphone, a television, or a monitor, e.g., an LCD or OLED television or monitor.

The load receives the portion of the force (514) and uses the force to generate the sound (516). For instance, the force causes the load to vibrate and produce sound waves to generate the sound.

In some implementations, the process 500 can include additional steps, fewer steps, or some of the steps can be divided into multiple steps. For example, a two-dimensional distributed mode actuator may perform steps 504 through 510 without performing the other steps in the process 500.

The distributed mode actuator may be mounted to the load at any appropriate angle. For example, the distributed mode actuator may be mounted perpendicularly to a target load, e.g., mechanical load. The load may be a distributed mode panel. In some examples, the distributed mode actuator may be mounted parallel to a target load.

In some implementations, when the distributed mode actuator is included in a smartphone, the smartphone may include a display, e.g., a display panel, one or more processors, and one or more memories. The display may be presented as a load to the distributed mode actuator to generate sound. In some examples, the smartphone may present a load different from the display to the distributed mode actuator to use when generating a sound.

The memories may store instructions for an application, e.g., from which the distributed mode actuator can receive the input identifying the sound to output. The one or more processors, e.g., one or more application processors, may use the instructions stored on the one or more memories to execute the application. During execution of the application, e.g., a phone application or a music application or a game, the application may determine a sound to output to a user. The application provides, to the distributed mode actuator, data for the sound.

A drive module included in the distributed mode actuator receives the data for the sound as input. The drive module uses the data to provide voltage to one or more electrodes included in the distributed mode actuator.

In some examples, the one or more processors, the one or more memories, or both, are separate from the drive module. For example, the drive module may include at least one processor, at least one memory, or both. The at least one processor may be a different set of processors from the one or more processors. The at least one memory may be a different memory from the one or more memories.

In some implementations, a multi-dimensional distributed mode actuator may include the transducer that has different vertical, e.g., height, displacement along a width of the transducer. For instance, an actuator that generates force in more than two dimensions may use the systems and methods described in this document.

In some implementations, a haptic feedback system may include the distributed mode actuator. For example, the haptic feedback system may use the distributed mode actuator to generate energy in a frequency range between 250 Hz and 300 Hz. The haptic feedback system may be part of a single component that is also used to generate sound or a separate from a component that is used to generate sound.

Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non-transitory program carrier for execution by, or to control the operation of, data processing apparatus. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. The computer storage medium can be a machine-readable storage device, a machine-readable storage substrate, a random or serial access memory device, or a combination of one or more of them.

The term "data processing apparatus" refers to data processing hardware and encompasses all kinds of apparatus, devices, and machines for processing data, including by way of example a programmable processor, or multiple processors. The apparatus can also be or further include special purpose logic circuitry, e.g., an FPGA (field programmable gate array) or an ASIC (application-specific integrated circuit). The apparatus can optionally include, in addition to hardware, code that creates an execution environment for computer programs, e.g., code that constitutes processor firmware, a protocol stack, an operating system, or a combination of one or more of them.

For example, a panel loudspeaker, e.g., a drive module, may include a data processing apparatus. The panel loudspeaker may use the data processing apparatus, in conjunction with at least one memory, to perform one or more of the operations described in this document.

A computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a computing environment. A computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A computer program can be deployed to be executed on one computer or on multiple computers that are located at one site or distributed across multiple sites and interconnected by a communication network.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

Computers suitable for the execution of a computer program include, by way of example, general or special purpose microprocessors or both, or any other kind of central processing unit. Generally, a central processing unit will receive instructions and data from a read-only memory or a random access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer-readable media suitable for storing computer program instructions and data include all forms of nonvolatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

A panel loudspeaker or a distributed mode actuator or both may include one or more memories that store instructions which, when executed by the panel loudspeaker or the distributed mode actuator, cause the panel loudspeaker or the distributed mode actuator to perform one or more operations described in this document. For instance, the instructions may cause the panel loudspeaker or the distributed mode actuator, e.g., a drive module, to determine an output frequency subset, energize one or more electrodes, or both. In some examples, the drive module may include the one or more memories or some of the one or more memories.

To provide for interaction with a user, embodiments of the subject matter described in this specification can be implemented on a computer having a display device, e.g., an LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

While this specification contains many specific implementation details, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. An actuator comprising:
a transducer adapted to create a force to cause vibration of a load to generate sound waves, the transducer having a width along a first axis and a length along a second axis perpendicular to the first axis, the transducer comprising:
a first section; and
a second section adapted to move separately from the first section during operation of the actuator, the first section and the second section being at different locations along the first axis;
a transfer portion connected to the transducer along a first side of the transfer portion extending along the first axis; and
a stub connected to the transfer portion along a second side of the transfer portion that is parallel to the first axis and opposite from the first side connected to the transducer, the stub being configured to connect to the load to transfer the force from the transducer to the load and cause the load to vibrate.

2. The actuator of claim 1, wherein a range of movement of the first section during operation of the actuator is different from a range of movement of the second section.

3. The actuator of claim 1, wherein the first section and the second section are at different locations along the second axis.

4. The actuator of claim 3, wherein:
a distance along the second axis between the first side of the transfer portion and the first section is less than a distance along the second axis between the first side of the transfer portion and the second section; and
a range of movement of the first section during operation of the actuator is less than a range of movement of the second section.

5. The actuator of claim 1, wherein the first section and the second section are a same distance away from the first side of the transfer portion along the second axis.

6. The actuator of claim 1, wherein the transducer has a height along a third axis perpendicular to both the first axis and the second axis, wherein the first section and the second section are adapted to move separately along the third axis during operation of the actuator.

7. The actuator of claim 1, wherein the width is a first width and the transfer portion has a second width along the first axis that is less than the first width.

8. The actuator of claim 7, the transfer portion having a third side extending along the second axis, wherein:
a distance along the first axis between the third side of the transfer portion and the first section is less than a distance along the first axis between the third side of the transfer portion and the second section; and
a range of movement of the first section during operation of the actuator is less than a range of movement of the second section.

9. The actuator of claim 1, comprising a third section adapted to move separately from the first section and the second section during operation of the actuator, the third section being at different locations from both the first section and the second section along the first axis.

10. The actuator of claim 1, wherein the transducer comprises one or more piezoelectric layers.

11. A panel audio loudspeaker comprising:
a display; and
an actuator comprising:
a transducer adapted to create a force to cause vibration of a display to generate sound waves, the transducer having a width along a first axis and a length along a second axis perpendicular to the first axis, the transducer comprising:
a first section; and
a second section adapted to move separately from the first section during operation of the actuator, the first section and the second section being at different locations along the first axis;
a transfer portion connected to the transducer along a first side of the transfer portion extending along the first axis; and
a stub connected to the transfer portion along a second side of the transfer portion that is parallel to the first axis and opposite from the first side connected to the transducer, the stub being configured to connect to the display to transfer the force from the transducer to the display and cause the display to vibrate.

12. The panel audio loudspeaker of claim 11, wherein:
the transducer is connected to one or more electrodes, and
the panel audio loudspeaker comprises a drive module to provide voltage to the one or more electrodes to cause the transducer to move and create the force.

13. The panel audio loudspeaker of claim 12, wherein:
the first section is connected to a first electrode of the one or more electrodes; and
the second section is connected to a second electrode of the one or more electrodes.

14. The panel audio loudspeaker of claim 13, wherein the drive module provides a first voltage to the first electrode and a second voltage to the second electrode.

15. The panel audio loudspeaker of claim 13, wherein the drive module provides a same voltage to the first electrode and to the second electrode.

16. The panel audio loudspeaker of claim 12, wherein the first section and the second section are each connected to a common electrode of the one or more electrodes.

17. The panel audio loudspeaker of claim 12, wherein:
the transducer comprises a first surface and a second surface separated by a height along a third axis perpendicular to both the first axis and the second axis;
at least one of the one or more electrodes is connected to the first surface; and
at least one of the one or more electrodes is connected to the second surface.

18. The panel audio loudspeaker of claim 11, wherein the first section and the second section are at different locations along the second axis.

19. The panel audio loudspeaker of claim 11, wherein the width is a first width, and the transfer portion has a second width along the first axis that is less than the first width.

20. A mobile device, comprising:
a housing; and
the panel audio loudspeaker of claim 11.

* * * * *